United States Patent [19]

Slomowitz

[11] Patent Number: 4,888,088
[45] Date of Patent: Dec. 19, 1989

[54] IGNITOR FOR A MICROWAVE SUSTAINED PLASMA

[75] Inventor: Harry Slomowitz, Walnut Creek, Calif.

[73] Assignee: Tegal Corporation, Petaluma, Calif.

[21] Appl. No.: 319,020

[22] Filed: Mar. 6, 1989

[51] Int. Cl.$^4$ ..................... H01L 21/306; B44C 1/22; C03C 15/00; C03C 25/06
[52] U.S. Cl. .................................. 156/643; 118/50.1; 156/646; 156/662; 156/345; 204/192.37; 427/38
[58] Field of Search ............ 156/643, 646, 657, 659.1, 156/662, 345; 427/38, 39; 204/192.32, 192.37, 298.38; 118/728, 50.1, 620; 250/493.1; 422/186.04, 906, 907

[56] References Cited

U.S. PATENT DOCUMENTS

| 4,175,235 | 11/1979 | Niwa et al. | 250/542 |
| 4,316,791 | 2/1982 | Taillet | 204/298.38 |
| 4,351,714 | 9/1982 | Kuriyama | 204/298 |
| 4,581,100 | 4/1986 | Hatzakis et al. | 156/643 |
| 4,673,456 | 6/1987 | Spencer et al. | 156/345 |
| 4,831,963 | 5/1989 | Saito et al. | 118/723 |

Primary Examiner—William A. Powell
Attorney, Agent, or Firm—Paul F. Wille

[57] ABSTRACT

A high frequency, high voltage is capacitively applied to a process gas through a quartz tube to ignite a glow discharge within the tube. The quartz tube runs through a microwave cavity and the ignitor is positioned upstream of the cavity. The cavity is tuned for a steady state glow discharge and is not changed during initiation of the plasma. The ignitor excites the process gas into active species and the gas flow takes the species through the cavity where the microwave energy brings the gas to an ionized state and the plasma is sustained.

11 Claims, 1 Drawing Sheet

IGNITOR FOR A MICROWAVE SUSTAINED PLASMA

BACKGROUND OF THE INVENTION

This invention relates to plasma glow discharges and, in particular, to glow discharges sustained by microwave radiation.

The use of plasma glow discharges for processing semiconductor wafers, either for etching or deposition, has greatly increased in the last several years. However, several broad trends have caused a need for a new method for generating the plasma. In the past, the plasma has typically been generated by coupling relatively high power (five hundred watts or more) of RF energy into a chamber containing one or more gases. The coupling is by way of parallel electrodes forming a capacitor, one electrode of which is adapted to hold the semiconductor wafer.

As wafer diameters have increased, the amount of power has increased to maintain a given power density. As the geometry of devices has decreased in size, the devices become ever more delicate. The point has been reached, or will very soon be reached, where the devices simply cannot withstand the applied power passing through the wafer.

An early solution to this problem has been the use of screen grids within the chamber to isolate the wafer being processed. Another solution is the so-called downstream etcher, a name covering several types of devices wherein one hopes that the lifetime of the reactive, non-charged species exceeds the time it takes for the species to drift to the surface of the wafer. One type of downstream device uses microwaves to sustain the discharge.

With microwaves, or any other type of discharge, there are two modes of operation. The first is the starting mode. The second is the sustained running mode. Just as with an automobile engine or a fluorescent lamp or any of a host of other common devices, the two modes are very different. Just as with these other devices, the starting mode is the hardest on the equipment. There is relatively little said in the prior art on how to initiate a plasma discharge in a reliable, repeatable, commercially feasible manner.

The chamber in which the discharge takes place has an electrical impedance. Considering the case of parallel plate electrodes, it should seem intuitively true that the impedance when there is no discharge is very different from the impedance when there is a discharge. Thus, one is faced with the problem of applying power to a nonresonant, reactive load. As is well known, such a load causes a great deal of power to be reflected back to the source. As is also well known, reflected power tends to destroy the final stage in the RF amplifier. The same is true whether the signal is at a microwave frequency or a lower frequency.

One solution to this problem has been to use relatively low Q tuned circuits in the final stages of the amplifier. This provides a broadly tuned circuit but tends to consume a lot of power.

Another solution has been to use an automatic tuning mechanism of some sort. This works reasonably well at high frequencies, but becomes more difficult at microwave frequencies. The mechanical plungers and the like tend to require frequent adjustment and are undesirable for the customer and the equipment manufacturer.

Yet another solution, typified by U.S. Pat. No. 4,175,235 - Niwa et al., uses internal electrodes and an electric spark generator for initiating the glow discharge. Depending upon the gases utilized, the electrodes can be corroded or deposited upon or, worse, can provide contaminating ions into the reaction chamber even when the electrodes are not carrying a spark.

Another solution is to use a UV light source within the plasma chamber to initiate the glow discharge. A problem with this approach is the time it takes for the UV to provide a sufficient electron density for the glow to stabilize. During this time, the impedance of the glow varies considerably. Some manufacturers leave the UV source turned on continuously to minimize this problem. This raises problems of the reliability of the UV source and assuring that the UV is off before the unit is opened for service.

In view of the foregoing, it is therefore an object of the present invention to provide an ignitor for a microwave sustained plasma.

Another object of the present invention is to provide an improved equipment using a microwave sustained plasma for treating semiconductor wafers by enabling the microwave power source to have a fixed tune with relatively high Q components.

A further object of the present invention is to provide an ignitor located outside the discharge chamber to avoid any deterioration of the ignitor by the gases used for the plasma.

SUMMARY OF THE INVENTION

The foregoing objects are achieved in the present invention wherein a high frequency, high voltage is capacitively applied to a process gas through a quartz tube which contains the gas. The plasma is initiated with the high frequency RF discharge. Microwave energy then brings the gas to an ionized state and the plasma is sustained. As used herein, "high" frequency refers to a frequency on the order of 1-10 Mhz. ("Low" frequency is on the order of 100 khz. and "very high" frequency is on the order of 100 Mhz., etc.).

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
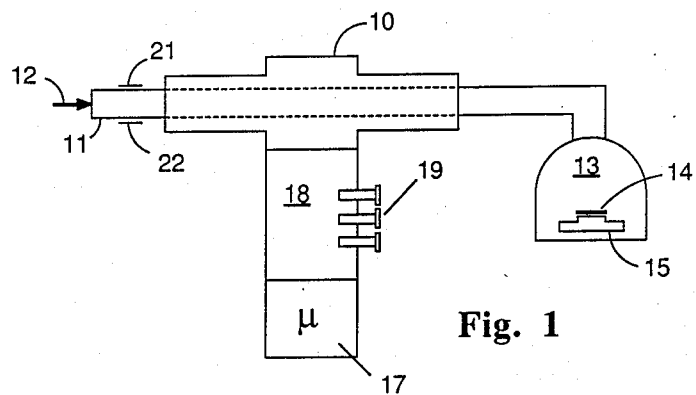
FIG. 1 illustrates a microwave sustained plasma system in accordance with the present invention.

FIG. 1 illustrates a downstream plasma system for treating semiconductor wafers in which the process gas is excited by means of microwave energy. Specifically, microwave cavity 10 encloses a portion of tube 11 which contains one or more gases from a suitable source, indicated by arrow 12. Tube 11 is transparent to microwave radiation and conveys gases from source 12 to reactor chamber 13. Reactor chamber 13 contains wafer 14 resting on electrode 15. Chamber 13 and electrode 15 may comprise any suitable configuration for the processing of semiconductor wafers. For example, electrode 15 can be grounded or biased as deemed necessary and typically comprises wafer temperature control means, such as water or gas cooling or heating.

The gas flowing through tube 11 is excited by means of microwave energy from a microwave generator 17 which is coupled to cavity 10 by way of tuning wave guide 18. The impedance of wave guide 18 is varied by adjustment of tuning plungers 19, as well known per se in the art.

As previously noted, cavity 10 presents a significantly different impedance to wave guide 18 and generator 17, depending upon whether or not a plasma exists inside tube 11, within cavity 10. In accordance with a preferred embodiment of the present invention, tuning wave guide 18 is adjusted so that cavity 10 provides a proper, i.e. resistive, load for generator 17 when cavity 10 contains a plasma discharge. Ordinarily, this would make it extremely difficult to ignite the plasma and would likely cause damage to generator 17. However, in accordance with the present invention, electrodes 21 and 22 are positioned adjacent tube 11. A high frequency RF signal is applied to electrodes 21 and 22 causing the gas at that location to ionize. As the gas flows into chamber 10, and microwave energy is applied from generator 17, generator 17 "sees" a plasma discharge within cavity 10 and a resistive or very nearly resistive load. Since electrodes 21 and 22 are positioned outside of tube 11, they neither deteriorate from the process gas nor contribute contaminants to the process gas.

Figure 2:
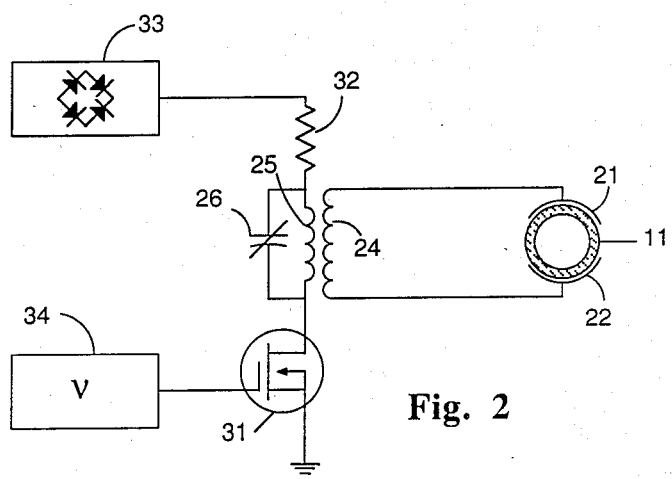
FIG. 2 illustrates a preferred embodiment of an ignitor in accordance with the present invention.

FIG. 2 illustrates in greater detail an ignitor in accordance with the present invention. Electrodes 21 and 22 conform approximately the outside shape of tube 11, illustrated in cross-section and form the plates of a capacitor. Electrodes 21 and 22 are connected to secondary winding 24 of a step-up transformer. Primary winding 25 of the step-up transformer has capacitor 26 connected in parallel therewith forming a tank circuit and load for amplifier 31. Amplifier 31, which preferably comprises a high power FET transistor, such as type MTM5N100 available from Motorola, Inc., has the source thereof connected to ground and the drain thereof connected through the tank circuit and load resistor 32 to power supply 33. The gate of amplifier 31 is connected to source 34 of RF signal.

In operation, source 34 drives amplifier 31 at a frequency sufficient for good coupling through the wall of tube 11, e.g. one MHz. Capacitor 26 minimizes the reactance of primary winding 25 of the step-up transformer. The step-up transformer preferably has a turns ratio on the order of 5:1. Load resistor 32 provides sufficient resistance to limit current through amplifier 31 to within its operating range.

For example, using a MTM5N100 transistor for amplifier 31, load resistor 32 has a resistance of ten ohms. Power supply 33 comprises suitable rectifying and doubling circuitry, known per se in the art, to provide an output voltage of approximately 500 volts DC. In an actual embodiment of the present invention, the step-up transformer had a turns ratio of 5:1, providing a voltage across electrodes 21 and 22 of approximately 3000 volts.

As recognized by those of skill in the art, the voltage and frequency depend upon a number of factors, such as the diameter of tube 11, the material from which tube 11 is made, the area of electrodes 21 and 22, and the pressure and composition of the gas within tube 11. Generally speaking, a frequency of 1 MHz or so provides sufficient coupling through tube 11 to produce sufficient ion density for successfully initiating a plasma within cavity 10. Tube 11 can comprise any non-conductive material such as quartz or ceramic, where "ceramic" includes such materials as sapphire (aluminum oxide).

There is thus provided by the present invention of a simple ignitor for a microwave sustained, downstream plasma discharge. One obtains a stable and less expensive microwave system by enabling one to avoid having to retune the microwave system during the start and run modes of operation.

Having thus described the invention it will be apparent to those of ordinary skill in the art that various modifications can be made within the scope of the present invention. For example, transistors other than the FET illustrated can be used for driving electrodes 21 and 22. In general, the particular components used in the circuit illustrated in FIG. 2 are chosen primarily on the basis of reliability and cost. The actual starting cycle takes but a few seconds although one may continue the ignitor for thirty seconds or so to assure a start has taken place. Further, one can add various control mechanisms for sensing a successful start and terminating the start cycle if a sustained plasma is not detected, e.g. by photodiodes. Such control systems are well known to those of skill in the art and do not affect the present invention.

I claim:

1. A method for providing a plasma glow discharge in a plasma reactor containing one or more process gases for treating a semiconductor wafer comprising the steps of:
    applying high frequency RF energy to said gas to initiate said plasma; and
    applying microwave energy to said gas to sustain said plasma.

2. The method as set forth in claim 1 and further comprising the step of:
    terminating said high frequency RF energy after said microwave energy is applied.

3. The method as set forth in claim 2 wherein said high frequency RF energy is applied by capacitive coupling through a non-conductive container for said gas.

4. In apparatus for treating a semiconductor wafer using gases activated by microwave energy, said apparatus having a source of one or more gases, a non-conductive conduit for said gases; a first chamber enclosing a portion of said conduit and through which microwave energy is coupled to form a plasma in said gases, a second chamber into which said gases flow and which contains said semiconductor wafer, ignitor means located upstream of said first chamber for establishing a plasma in said first chamber, and microwave means coupled to said first chamber for sustaining said plasma, wherein the improvement comprises:
    said ignitor means comprises means for coupling RF energy to said gases for causing a plasma therein.

5. The apparatus as set forth in claim 4 wherein said ignitor means comprises:
    means for generating a high voltage, RF signal; and
    means for coupling said signal to said conduit.

6. The apparatus as set forth in claim 5 wherein said means for coupling comprises:
    capacitor plates conforming approximately to the outside shape of said conduit for coupling said RF signal to within said conduit.

7. The apparatus as set forth in claim 6 wherein said RF signal has a frequency of approximately 1 Mhz or greater.

8. The apparatus as set forth in claim 5 wherein said conduit comprises quartz.

9. The apparatus as set forth in claim 5 wherein said conduit comprises ceramic.

10. The apparatus as set forth in claim 6 wherein said means for generating comprises:
- a source of RF signal;
- a step-up transformer having the secondary winding thereof connected to said plates; and
- an amplifier having the input thereof connected to said source of RF signal and the output thereof connected to the primary winding of said step-up transformer.

11. The apparatus as set forth in claim 10 and further comprising:
- tuning means connected to said primary winding for minimizing the reactance of said winding.

* * * * *